United States Patent
Hsieh et al.

(10) Patent No.: US 10,867,099 B2
(45) Date of Patent: Dec. 15, 2020

(54) SYSTEM FOR DESIGNING INTEGRATED CIRCUIT LAYOUT AND METHOD OF MAKING THE INTEGRATED CIRCUIT LAYOUT

(71) Applicant: TAIWAN SEMICONDUCTOR MANUFACTURING COMPANY, LTD., Hsinchu (TW)

(72) Inventors: Shang-Chih Hsieh, Yangmei (TW); Hui-Zhong Zhuang, Kaohsiung (TW); Ting-Wei Chiang, New Taipei (TW); Chun-Fu Chen, Chiayi (TW); Hsiang-Jen Tseng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/401,290

(22) Filed: May 2, 2019

(65) Prior Publication Data
US 2019/0258768 A1 Aug. 22, 2019

Related U.S. Application Data

(62) Division of application No. 15/601,697, filed on May 22, 2017, now Pat. No. 10,289,789, which is a
(Continued)

(51) Int. Cl.
*G06F 30/392* (2020.01)
*H01L 21/768* (2006.01)
(Continued)

(52) U.S. Cl.
CPC .......... *G06F 30/392* (2020.01); *H01L 21/768* (2013.01); *H01L 27/0207* (2013.01);
(Continued)

(58) Field of Classification Search
None
See application file for complete search history.

(56) References Cited

U.S. PATENT DOCUMENTS 4,412,240 A 10/1983 Kikuchi et al.
7,500,211 B2 3/2009 Komaki
(Continued)

FOREIGN PATENT DOCUMENTS

CN 1794459 6/2006
JP S55115353 9/1980
(Continued)

OTHER PUBLICATIONS

Office Action dated Jul. 1, 2015 and English translation from corresponding No. JP 2014-091435.
(Continued)

*Primary Examiner* — Thien F Tran
(74) *Attorney, Agent, or Firm* — Hauptman Ham, LLP

(57) ABSTRACT

An integrated circuit designing system includes a non-transitory storage medium, the non-transitory storage medium being encoded with a layout of a standard cell corresponding to a predetermined manufacturing process, the predetermined manufacturing process having a nominal minimum pitch of metal lines along a predetermined direction, the layout of the standard cell having a cell height along the predetermined direction, and the cell height is a non-integral multiple of the nominal minimum pitch. The integrated circuit designing system further includes a hardware processor communicatively coupled with the non-transitory storage medium and configured to execute a set of instructions for generating an integrated circuit layout based on the layout of the standard cell and the nominal minimum pitch.

13 Claims, 4 Drawing Sheets

Related U.S. Application Data division of application No. 14/253,205, filed on Apr. 15, 2014, now Pat. No. 9,659,129.

(60) Provisional application No. 61/818,705, filed on May 2, 2013.

(51) Int. Cl.
  *H01L 27/118* (2006.01)
  *H01L 27/02* (2006.01)

(52) U.S. Cl.
  CPC .......... *H01L 27/11807* (2013.01); *H01L 2027/11875* (2013.01); *H01L 2924/0002* (2013.01)

(56) References Cited

U.S. PATENT DOCUMENTS

| | | |
|---|---|---|
| 8,183,600 B2 | 5/2012 | Shimizu |
| 8,410,526 B2 | 4/2013 | Shimizu |
| 8,739,104 B1 | 5/2014 | Penzes |
| 9,158,877 B2 | 10/2015 | Hsieh et al. |
| 9,501,600 B2 | 11/2016 | Hsieh et al. |
| 9,659,129 B2 | 5/2017 | Hsieh |
| 10,289,789 B2 * | 5/2019 | Hsieh ............ H01L 21/768 |
| 10,380,306 B2 * | 8/2019 | Hsieh ............ G06F 30/39 |
| 10,402,529 B2 * | 9/2019 | Hanchinal ...... H01L 21/027 |
| 2005/0001271 A1 | 1/2005 | Kobayashi |
| 2006/0095870 A1 * | 5/2006 | Tai ............... G06F 30/39 |
| | | 716/120 |
| 2006/0136848 A1 | 6/2006 | Ichiryu et al. |
| 2007/0224521 A1 * | 9/2007 | Furukawa ....... G03F 7/0005 |
| | | 430/5 |
| 2008/0078741 A1 * | 4/2008 | Kotani ............ G03F 1/50 |
| | | 216/41 |
| 2009/0032963 A1 | 2/2009 | Tran |
| 2009/0138840 A1 | 5/2009 | Ichiryu et al. |
| 2010/0148219 A1 | 6/2010 | Shimizu |
| 2014/0327081 A1 | 11/2014 | Hsieh |
| 2014/0327471 A1 | 11/2014 | Hsieh et al. |

FOREIGN PATENT DOCUMENTS

| | | |
|---|---|---|
| JP | 11-505943 | 5/1999 |
| JP | 2000260877 | 9/2000 |
| JP | 2004342757 | 12/2004 |
| JP | 2007043049 | 2/2007 |
| JP | 2007-273762 | 10/2007 |
| JP | 2010-141187 | 6/2010 |
| JP | 2010536176 | 11/2010 |

OTHER PUBLICATIONS

Office Action dated Nov. 11, 2015 and English translation from corresponding No. JP 2014-091435.
Office Action dated Jun. 3, 2016 from corresponding No. CN 201410181666.1.
Office Action dated Apr. 19, 2017 from corresponding No. JP 2014-91435.
Office Action dated Apr. 26, 2017 from corresponding No. JP 2016-135834.
Office Action dated Dec. 13, 2017 from corresponding application No. JP 2016-135834.

\* cited by examiner

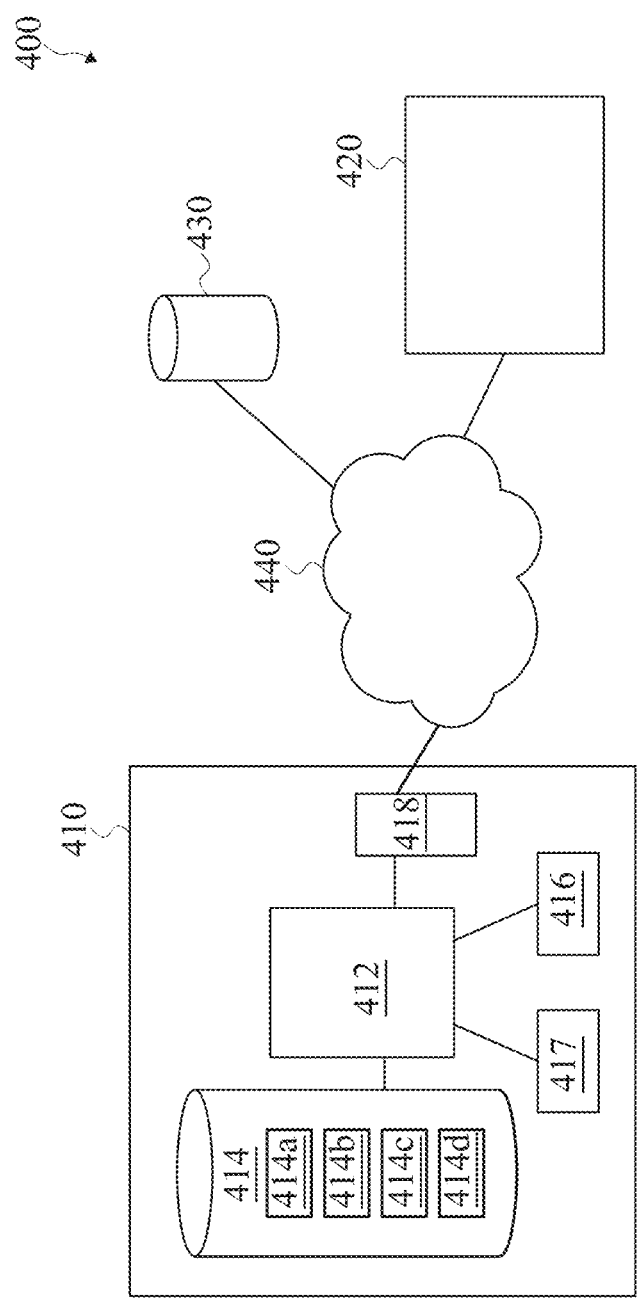

SYSTEM FOR DESIGNING INTEGRATED CIRCUIT LAYOUT AND METHOD OF MAKING THE INTEGRATED CIRCUIT LAYOUT

PRIORITY CLAIM

The present application is a divisional of U.S. application Ser. No. 15/601,697, filed May 22, 2017, which is a divisional of U.S. application Ser. No. 14/253,205, filed Apr. 15, 2014, now U.S. Pat. No. 9,659,129, issued May 23, 2017, which claims priority of U.S. Provisional Application No. 61/818,705, filed on May 2, 2013, the disclosures of which are incorporated herein by reference in their entireties.

RELATED APPLICATIONS

The present application is related to U.S. application Ser. No. 14/051,881, filed Oct. 11, 2013, now U.S. Pat. No. 9,501,600, issued Nov. 22, 2016 and U.S. application Ser. No. 14/015,924, filed Aug. 30, 2013, now U.S. Pat. No. 9,158,877, issued Oct. 13, 2015, the disclosures of which are incorporated herein by reference in their entireties.

BACKGROUND

In the design of an integrated circuit, standard cells having predetermined functions are used. Pre-designed layouts of standard cells are stored in cell libraries. When designing an integrated circuit, the pre-designed layouts of the standard cells are retrieved from the cell libraries and placed into one or more desired locations on an integrated circuit layout. Routing is then performed to connect the standard cells with each other using metal lines. The integrated circuit layout is thereafter used to manufacture the integrated circuit using a predetermined semiconductor manufacturing process.

DESCRIPTION OF THE DRAWINGS

One or more embodiments are illustrated by way of example, and not by limitation, in the figures of the accompanying drawings, wherein elements having the same reference numeral designations represent like elements throughout.

FIG. 4 is a functional block diagram of an integrated circuit designing system in accordance with one or more embodiments.

DETAILED DESCRIPTION

Figure 1:
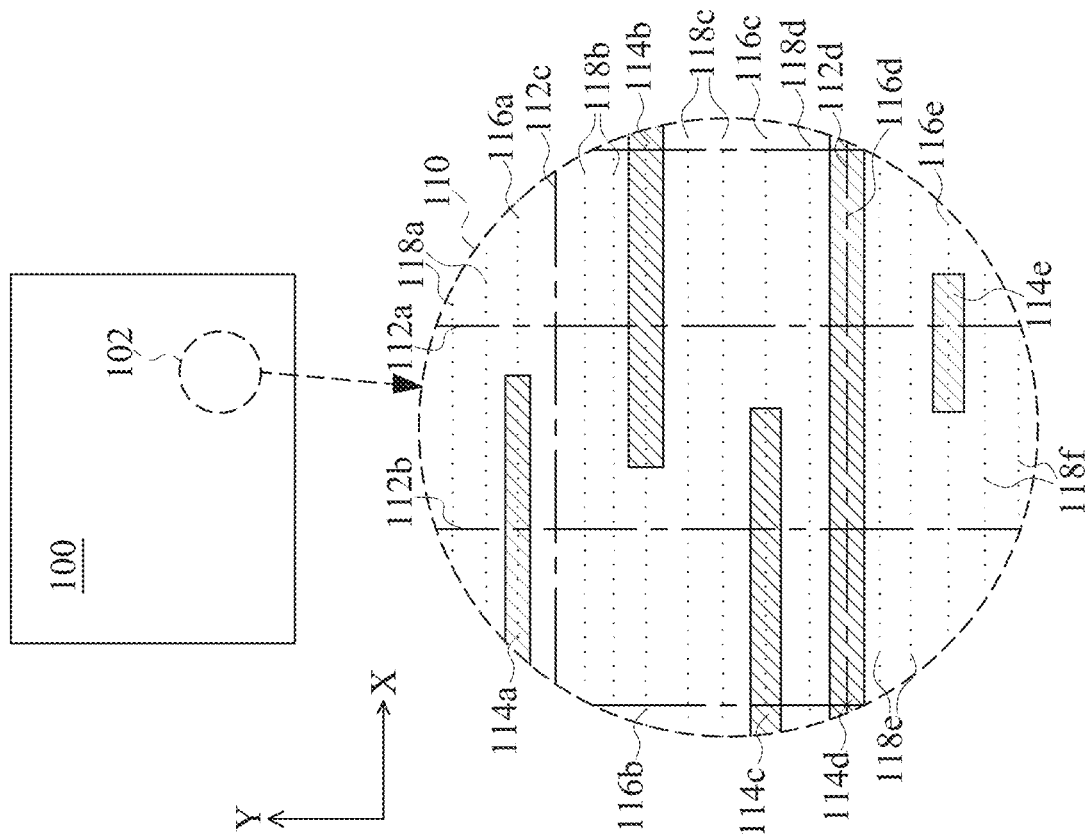
FIG. 1 is a top view of an integrated circuit, including an enlarged view of a portion of the integrated circuit, in accordance with one or more embodiments.

It is understood that the following disclosure provides one or more different embodiments, or examples, for implementing different features of the disclosure. Specific examples of components and arrangements are described below to simplify the present disclosure. These are, of course, examples and are not intended to be limiting. In accordance with the standard practice in the industry, various features in the drawings are not drawn to scale and are used for illustration purposes only.

Moreover, spatially relative terms, for example, "lower," "upper," "horizontal," "vertical," "above," "below," "up," "down," "top," "bottom," "left," "right," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a top view of an integrated circuit 100, including an enlarged view 110 of a portion 102 of the integrated circuit, in accordance with one or more embodiments. The integrated circuit 100 includes a plurality of pre-designed circuit blocks also referred to as standard cells (having cell boundaries indicated by reference lines 112a and 112b along the Y direction and 112c and 112d along the X direction). One or more layers of interconnection structures, such as metal lines 114a, 114b, 114c, 114d, and 114e, are formed over the standard cells. Cell boundaries define cell regions of standard cells, and the cell regions of neighboring standard cells do not overlap. In some embodiments, at least one layer of the layers of interconnection structures is routed along a predetermined direction (e.g., the X direction), and at least another one layer of the layers of interconnection structures is routed along another predetermined direction (e.g., the Y direction). In some embodiments, different layers of interconnection structures are connected by via plugs.

In FIG. 1, details of the standard cells are omitted. In some embodiments, one or more of the standard cells are logic gate cells. In some embodiments, logic gate cells include AND, OR, NAND, NOR, XOR, INV, AND-OR-Invert (AOI), OR-AND-Invert (OAI), MUX, Flip-flop, BUFF, Latch, delay, or clock cells. In some embodiments, each of the standard cells includes at least one active device, such as a metal-oxide semiconductor field effect transistor, a junction field effect transistor, a bipolar junction transistor, or other suitable active device.

Figure 2:
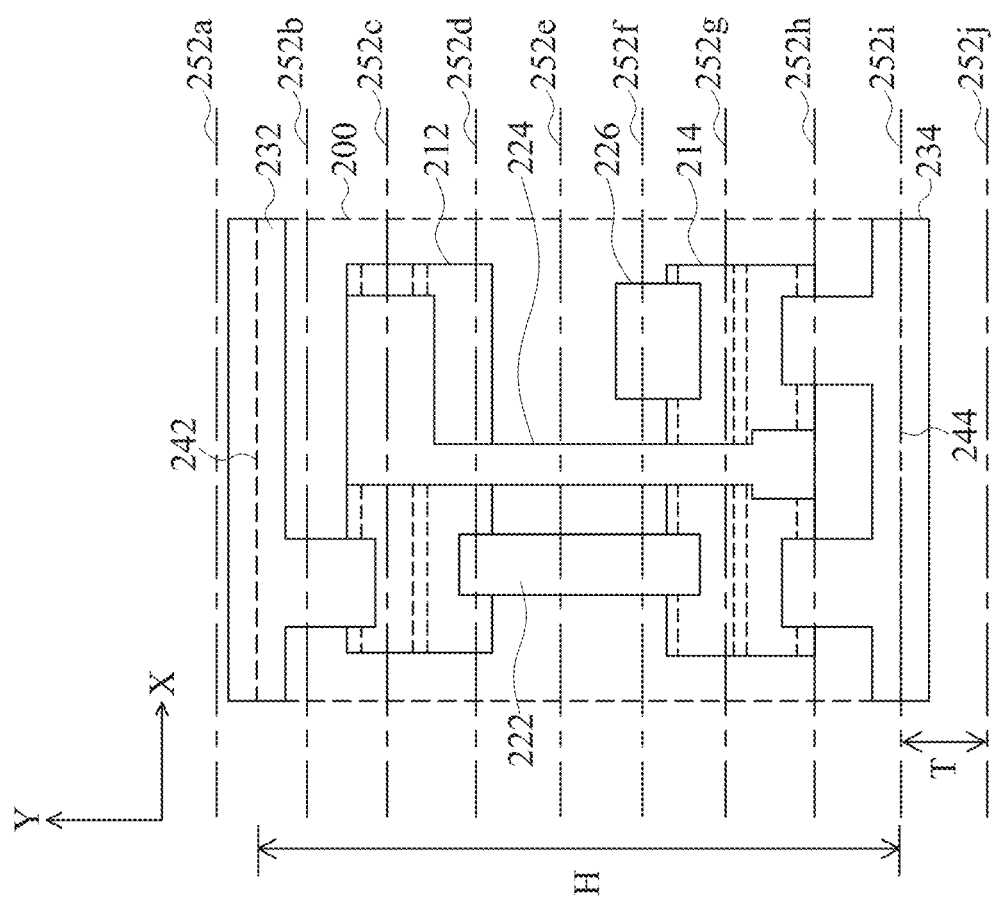
FIG. 2 is a top view of a standard cell in an integrated circuit in accordance with one or more embodiments.

Metal lines 114a, 114b, 114c, 114d, and 114e extend along the X direction and overlap corresponding virtual grid lines 116a, 116b, 116c, 116d, and 116e. Virtual grid line 116d coincides with cell boundary 112d. Virtual grid lines 116a-e and other virtual grid lines 118a-f are arranged in parallel along the X direction, and two adjacent lines of the plurality of virtual grid lines 116a-e and 118a-f are separated by a nominal minimum pitch T (FIG. 2). The nominal minimum pitch T is a predetermined minimum routing pitch of metal lines for forming an interconnection structure according to a predetermined semiconductor manufacturing process. In some embodiments, the nominal minimum pitch T is determined according to one or more characteristics of the predetermined semiconductor manufacturing process, including a wave length for a lithographic process, a selectivity of an etching process, a material of the metal lines, a reasonable tolerance of errors, and an expected yield rate of the predetermined semiconductor manufacturing process. In a place and routing software tool, the metal lines of an integrated circuit layout along the X direction are arranged (also known as "routing") according to the virtual grid lines 116a-e and 118a-f.

In some embodiments, each of the metal lines 114a-e includes a multi-layer structure including at least one barrier layer and a conductive layer. In some embodiments, one or more of the metal lines are replaceable by conductive lines including a non-metal conductive material.

FIG. 2 is a top view of a standard cell 200 in an integrated circuit in accordance with one or more embodiments. Standard cell 200 includes an N-type active region 212 for forming one or more P-type transistors and a P-type active region 214 for forming one or more N-type transistors. Standard cell 200 also includes conductive lines 222, 224, and 226 and power lines 232 and 234 connecting the one or more P-type transistors and the one or more N-type transistors to perform a predetermined function. In the embodiment depicted in FIG. 2, an upper cell boundary 242 is defined in the middle of a portion of power line 232 extending along the X direction, and a lower cell boundary 244 is defined in the middle of a portion of power line 234 extending along the X direction.

A plurality of virtual grid lines 252a-252j arranged in parallel along the X direction and sequentially arranged along the Y direction perpendicular to the direction X are also depicted in FIG. 2. As described in conjunction with FIG. 1, two adjacent lines of the plurality of virtual grid lines 252a-252j are separated by the nominal minimum pitch T.

Only one standard cell 200 and 10 virtual grid lines 252a-252j are depicted in FIG. 2. For an integrated circuit including the standard cell 200, other standard cells and virtual grid lines are omitted in FIG. 2 to avoid obscuring the explanation of the present disclosure. A person having ordinary skill in the art would appreciate that one or more other standard cells are adjacent to the standard cell 200, and one or more virtual grid lines are defined over the integrated circuit including the standard cell 200. Also, a person having ordinary skill in the art would appreciate that the standard cell 200 is usable as a standard cell of the integrated circuit 100 depicted in FIG. 1.

The standard cell 200 has a cell height H along the Y direction, which is defined as a distance between the upper cell boundary 242 and the lower cell boundary 244. The cell height H is a non-integral multiple of the nominal minimum pitch T. In the embodiment depicted in FIG. 2, the cell height H of the standard cell 200 is 7.5 T. In other words, a ratio of the cell height H to the nominal minimum pitch T is 7.5. In some embodiments, a ratio of the cell height H to the nominal minimum pitch T ranges from 6 to 16. In some embodiments, a ratio of the cell height to the nominal minimum pitch is p/q, and p and q are integers. In the embodiment depicted in FIG. 2, the lower cell boundary 244 is on one of the virtual grid lines 252i (i.e., on-grid), and the upper cell boundary 242 is not on any of the virtual grid line 252a-j (i.e., off-grid). In some embodiments, the upper cell boundary 242 is on-grid, and the lower cell boundary is off-grid. In some embodiments, both upper cell boundary 242 and lower cell boundary 244 are off-grid.

Conductive lines 222, 224, and 226 are configured to be connected to metal lines outside the standard cell 200, and thus are identified as input/output ports of the standard cell 200. In some embodiments, all conductive lines 222, 224, and 226 identified as input/output ports of the standard cell 200 overlap with one or more corresponding virtual grid lines (252d-252f for conductive line 222; 252c-252g for conductive line 224; and 252f for conductive line 226).

In addition, a plurality of metal lines (such as metal lines 114a-e in FIG. 1) is over the standard cell 200 and extends along the X direction. In some embodiments, the plurality of metal lines being separated, in the Y direction perpendicular to the X direction, by integral multiples of the nominal minimum pitch T.

Compared with designing standard cells that have cell heights being integral multiples of the nominal minimum pitch T, a circuit designer has more flexibility in designing the standard cell 200 as depicted in FIG. 2. For example, if a standard cell having a cell height of 7.5 T has already met a predetermined performance specification, the circuit designer need not enlarge the size of the standard cell to have a cell height of 8 T just for making the standard cell height an integral multiple of the nominal minimum pitch T. In many application, compared with using the counterparts having integral multiples of the nominal minimum pitch T cell heights, an integrated circuit using standard cells having non-integral multiples of the nominal minimum pitch T cell heights further reduce the overall die size of the integrated circuit.

Figure 3:
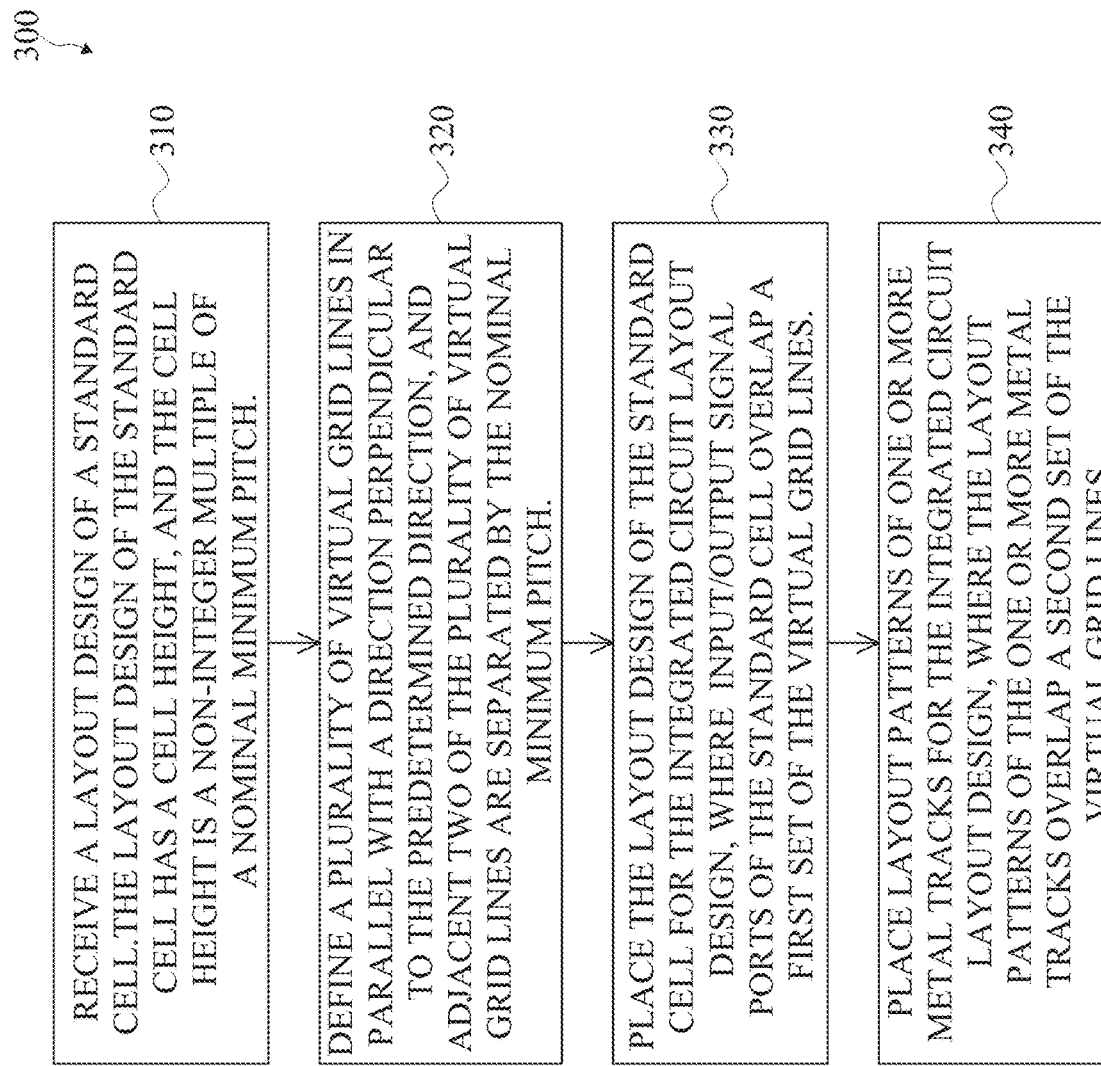
FIG. 3 is a flow chart of a method of designing an integrated circuit layout in accordance with one or more embodiments.

FIG. 3 is a flow chart of a method 300 of designing an integrated circuit layout in accordance with one or more embodiments. It is understood that additional operations may be performed before, during, and/or after the method 300 depicted in FIG. 3, and that some other processes may only be briefly described herein.

In order to manufacture the integrated circuit including a standard cell as described above in conjunction with the standard cell 200 depicted in FIG. 2 using a predetermined manufacturing process, an integrated circuit layout (414a in FIG. 4) is generated based on a circuit design (414b) stored in a schematic format or a circuit description language format.

In operation 310, as depicted in FIGS. 3 and 2, a hardware computer, based on the circuit design, receives a layout of a standard cell 200. The standard cell is designed corresponding to the predetermined manufacturing process, and the predetermined manufacturing process has a nominal minimum pitch T, along a direction Y, of metal lines. The layout of the standard cell 200 has a cell height H along direction Y, and the cell height H is a non-integral multiple of the nominal minimum pitch T.

In some embodiments, a ratio of the cell height H to the nominal minimum pitch T ranges from 6 to 16. In some embodiments, a ratio of the cell height H to the nominal minimum pitch T is 7.5. In some embodiments, a ratio of the cell height to the nominal minimum pitch is p/q, and p and q are integers.

In operation 320, as depicted in FIGS. 3 and 2, a plurality of virtual grid lines (such as virtual grid lines 252a-j) sequentially arranged along a direction X perpendicular to a Y direction is defined. Two adjacent lines of the plurality of virtual grid lines are separated by the nominal minimum pitch T.

In operation 330, as depicted in FIGS. 3 and 2, the layout of the standard cell 200 is placed for forming the integrated circuit layout in a manner such that, in at least one embodiment, all input/output signal ports (i.e., conductive lines 222, 224, and 226) of the standard cell 200 overlap a first set of the virtual grid lines 252c-252g. In some embodiments, one of the upper cell boundary 242 and the lower cell boundary 244 coincides with one of the plurality of virtual grid lines 252a-j, and the other one of the upper cell boundary 242 and the lower cell boundary 244 does not coincide with any of the plurality of virtual grid lines 252a-j.

In operation 340, as depicted in FIGS. 3 and 1, layout patterns of one or more metal lines (such as metal lines 114a-114e) are placed for forming the integrated circuit layout in a manner that the layout patterns of the one or more metal lines overlap a second set of the virtual grid lines 116a-e.

In some embodiments, the standard cell is a logic gate cell. In some embodiments, the logic gate cell is an AND, OR, NAND, NOR, XOR, AOI, OAI, MUX, Flip-flop, BUFF, Latch, INV, delay, or clock cell.

FIG. 4 is a functional block diagram of an integrated circuit designing system 400 in accordance with one or more embodiments. Integrated circuit designing system 400 includes a first computer system 410, a second computer system 420, a networked storage device 430, and a network 440 connecting the first computer system 410, the second computer system 420, and the networked storage device 430. In some embodiments, one or more of the second computer system 420, the storage device 430, and the network 440 are omitted.

The first computer system 410 includes a hardware processor 412 communicatively coupled with a non-transitory, computer readable storage medium 414 encoded with, i.e., storing, a generated integrated layout 414a, a circuit design 414b, and a computer program code 414c, i.e., a set of executable instructions. The processor 412 is electrically coupled to the computer readable storage medium 414. The processor 412 is configured to execute a set of instructions 414c encoded in the computer readable storage medium 414 in order to cause the computer 410 to be usable as a placing and routing tool for performing a portion or all of the operations as depicted in FIG. 3. In at least one embodiment, the hardware processor 412 is configured to execute the set of instructions 414c for generating the integrated circuit layout based on the layout of the standard cell and a nominal minimum pitch corresponding to a predetermined semiconductor manufacturing process.

In some embodiments, the processor 412 is a central processing unit (CPU), a multi-processor, a distributed processing system, an application specific integrated circuit (ASIC), and/or a suitable processing unit.

In some embodiments, the computer readable storage medium 414 is an electronic, magnetic, optical, electromagnetic, infrared, and/or a semiconductor system (or apparatus or device). For example, the computer readable storage medium 414 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 414 includes a compact disk-read only memory (CD-ROM), a compact disk-read/write (CD-R/W), and/or a digital video disc (DVD).

In some embodiments, the storage medium 414 stores the computer program code 414c configured to cause the first computer system 410 to perform a method 300 as depicted in FIG. 3. In some embodiments, the storage medium 414 also stores information needed for performing the method 300 or generated during performing the method 300, such as the generated integrated circuit layout 414a, the original circuit design 414b, and/or a library 414d including a layout of a standard cell 200.

The computer system 410 includes, in at least some embodiments, an input/output interface 416 and a display unit 417. The input/output interface 416 is coupled to the controller 412 and allows the circuit designer to manipulate the first computer system 410 in order to perform the method depicted in FIG. 3. In at least some embodiments, the display unit 417 displays the status of operation of the method depicted in FIG. 3 in a real-time manner and preferably provides a Graphical User Interface (GUI). In at least some embodiments, the input/output interface 416 and the display 417 allow an operator to operate the computer system 410 in an interactive manner.

In at least some embodiments, the computer system 410 also includes a network interface 418 coupled to the processor 412. The network interface 418 allows the computer system 410 to communicate with network 440, to which one or more other computer systems 420 and networked storage device 430 are connected. The network interface includes wireless network interfaces such as BLUETOOTH, WIFI, WIMAX, GPRS, or WCDMA; or wired network interface such as ETHERNET, USB, or IEEE-1394. In some embodiments, the method of FIG. 3 is implemented in two or more computer systems 410 and 420 and/or networked storage device 430, and information such as the original circuit design, the standard cell library, and/or the generated integrated circuit layout are exchanged between different computer systems 410 and 420 and/or networked storage device 430 via the network 440.

An aspect of this description relates to an integrated circuit designing system. The integrated circuit designing system includes a non-transitory storage medium, the non-transitory storage medium being encoded with a layout of a standard cell corresponding to a predetermined manufacturing process, the predetermined manufacturing process having a nominal minimum pitch of metal lines along a predetermined direction, the layout of the standard cell having a cell height along the predetermined direction, and the cell height is a non-integral multiple of the nominal minimum pitch. The integrated circuit designing system further includes a hardware processor communicatively coupled with the non-transitory storage medium and configured to execute a set of instructions for generating an integrated circuit layout based on the layout of the standard cell and the nominal minimum pitch. In some embodiments, a ratio of the cell height to the nominal minimum pitch ranges from 6 to 16. In some embodiments, the ratio of the cell height to the nominal minimum pitch is 7.5. In some embodiments, a ratio of the cell height to the nominal minimum pitch is p/q, and p and q are integers. In some embodiments, the standard cell is a logic gate cell. In some embodiments, the logic gate cell is an AND, OR, NAND, NOR, XOR, AOI, OAI, MUX, Flip-flop, BUFF, Latch, INV, delay, or clock cell. In some embodiments, the hardware processor, while executing the set of instructions, is configured to: generate a plurality of virtual grid lines in parallel with the a direction perpendicular to the predetermined direction, adjacent two of the plurality of virtual grid lines are separated by the nominal minimum pitch; place the layout of the standard cell for the integrated circuit layout, all input/output signal ports of the standard cell overlapping a first set of the virtual grid lines; and place layout patterns of one or more metal lines for the integrated circuit layout, the layout patterns of the one or more metal lines overlapping a second set of the virtual grid lines.

An aspect of this description relates to a method of making an integrated circuit, the method. The method includes arranging a plurality of virtual grid lines, wherein adjacent virtual grid lines of the plurality of virtual grid lines are separated, in a first direction, by a minimum nominal pitch determined by a manufacturing process for manufacturing the integrated circuit. The method includes placing a standard cell such that at least one of an upper boundary of the standard cell or a lower boundary of the standard cell is offset from every virtual grid line of the plurality of virtual grid lines. The method includes placing at least one metal line over each input/output (I/O) signal port of the standard cell to define an integrated circuit layout. In some embodiments, placing the standard cell comprises placing the standard cell so that every I/O signal port of the standard cell overlaps at least one virtual grid line of the plurality of virtual grid lines. In some embodiments, placing the standard cell comprises placing the standard cell so that both the upper boundary and the lower boundary are offset from every virtual gird line of the plurality of virtual grid lines. In some embodiments, receiving the standard cell, wherein the standard cell has a height which is a non-integral multiple of the minimum nominal pitch. In some embodiments, placing the standard cell comprises placing the standard cell so that at least one I/O signal port of the standard cell overlaps multiple virtual grid lines of the plurality of virtual grid lines. In some embodiments, placing the standard cell comprises placing the standard cell so that a plurality of I/O signal ports of the standard cell overlaps a first virtual grid line of the plurality of virtual grid lines. In some embodiments, the method further includes manufacturing the integrated circuit based on the integrated circuit layout.

An aspect of this description relates to a method of making an integrated circuit. The method includes placing a first standard cell in a layout, wherein the layout comprises a plurality of virtual grid lines, wherein adjacent virtual grid lines are separated in a first direction by a minimum nominal pitch determined by a manufacturing process for manufacturing the integrated circuit. The method includes placing a second standard cell in the layout, wherein the second standard cell defines an interface with the first standard cell, and the interface is between adjacent virtual gird lines of the plurality of virtual grid lines. The method includes placing at least one metal line over each input/output (I/O) signal port of the standard cell to define an integrated circuit layout. In some embodiments, the method further includes manufacturing the integrated circuit based on the integrated circuit layout. In some embodiments, the method further includes placing a third standard cell in the layout, wherein the third cell defines a second interface with the second standard cell, and the second interface is offset from each virtual grid line of the plurality of grid lines. In some embodiments, the method further includes placing a power line along the interface. In some embodiments, placing the power line comprises placing the power line having a projection, wherein the projection extends across a virtual grid line of the plurality of virtual grid lines. In some embodiments, placing the first standard cell comprising a plurality of conductive lines, and each conductive line of the plurality of conductive lines extends across at least one virtual gird line of the plurality of virtual grid lines.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making an integrated circuit, the method comprising:
   arranging a plurality of virtual grid lines, wherein adjacent virtual grid lines of the plurality of virtual grid lines are separated, in a first direction, by a minimum nominal pitch determined by a manufacturing process for manufacturing the integrated circuit;
   placing a standard cell such that at least one of an upper boundary of the standard cell or a lower boundary of the standard cell is offset from every virtual grid line of the plurality of virtual grid lines; and
   placing at least one metal line over each input/output (I/O) signal port of the standard cell to define an integrated circuit layout.

2. The method of claim 1, wherein placing the standard cell comprises placing the standard cell so that every I/O signal port of the standard cell overlaps at least one virtual grid line of the plurality of virtual grid lines.

3. The method of claim 1, wherein placing the standard cell comprises placing the standard cell so that both the upper boundary and the lower boundary are offset from every virtual gird line of the plurality of virtual grid lines.

4. The method of claim 1, further comprising receiving the standard cell, wherein the standard cell has a height which is a non-integral multiple of the minimum nominal pitch.

5. The method of claim 1, wherein placing the standard cell comprises placing the standard cell so that at least one I/O signal port of the standard cell overlaps multiple virtual grid lines of the plurality of virtual grid lines.

6. The method of claim 1, wherein placing the standard cell comprises placing the standard cell so that a plurality of I/O signal ports of the standard cell overlaps a first virtual grid line of the plurality of virtual grid lines.

7. The method of claim 1, further comprising manufacturing the integrated circuit based on the integrated circuit layout.

8. A method of making an integrated circuit, the method comprising:
   placing a first standard cell in a layout, wherein the layout comprises a plurality of virtual grid lines, wherein adjacent virtual grid lines are separated in a first direction by a minimum nominal pitch determined by a manufacturing process for manufacturing the integrated circuit;
   placing a second standard cell in the layout, wherein the second standard cell defines an interface with the first standard cell, and the interface is between adjacent virtual gird lines of the plurality of virtual grid lines; and
   placing at least one metal line over each input/output (I/O) signal port of the standard cell to define an integrated circuit layout.

9. The method of claim 8, further comprising manufacturing the integrated circuit based on the integrated circuit layout.

10. The method of claim 8, further comprising placing a third standard cell in the layout, wherein the third cell defines a second interface with the second standard cell, and the second interface is offset from each virtual grid line of the plurality of grid lines.

11. The method of claim 8, further comprising placing a power line along the interface.

12. The method of claim 11, wherein placing the power line comprises placing the power line having a projection, wherein the projection extends across a virtual grid line of the plurality of virtual grid lines.

13. The method of claim 8, wherein placing the first standard cell comprising a plurality of conductive lines, and each conductive line of the plurality of conductive lines extends across at least one virtual gird line of the plurality of virtual grid lines.

* * * * *